(12) United States Patent
Yang

(10) Patent No.: US 11,652,151 B2
(45) Date of Patent: May 16, 2023

(54) SEMICONDUCTOR DEVICE STRUCTURE WITH FINE CONDUCTIVE CONTACT AND METHOD FOR PREPARING THE SAME

(71) Applicant: NANYA TECHNOLOGY CORPORATION, New Taipei (TW)

(72) Inventor: Cheng-Ling Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 23 days.

(21) Appl. No.: 17/387,145

(22) Filed: Jul. 28, 2021

(65) Prior Publication Data
US 2023/0034084 A1   Feb. 2, 2023

(51) Int. Cl.
*H01L 29/45* (2006.01)
*H01L 21/3105* (2006.01)
*H01L 21/02* (2006.01)
*H01L 21/285* (2006.01)

(52) U.S. Cl.
CPC ........ *H01L 29/45* (2013.01); *H01L 21/02244* (2013.01); *H01L 21/28518* (2013.01); *H01L 21/31051* (2013.01)

(58) Field of Classification Search
None
See application file for complete search history.

(56) References Cited

U.S. PATENT DOCUMENTS

| | | | |
|---|---|---|---|
| 2004/0110370 A1 | 6/2004 | Okayama et al. | |
| 2011/0140195 A1* | 6/2011 | Zahurak | H01L 27/105 257/329 |
| 2013/0234279 A1 | 9/2013 | Kim et al. | |
| 2014/0073128 A1 | 3/2014 | Jong | |

FOREIGN PATENT DOCUMENTS

CN        109950152 A  *  6/2019

* cited by examiner

*Primary Examiner* — Michael Lebentritt
(74) *Attorney, Agent, or Firm* — Muncy, Geissler, Olds & Lowe, P.C.

(57) ABSTRACT

The present disclosure provides a semiconductor device structure with a conductive contact and a method for preparing the semiconductor device structure. The semiconductor device structure includes a dielectric layer disposed over a semiconductor substrate; a conductive contact penetrating through the dielectric layer; and a metal oxide layer separating the conductive contact from the dielectric layer, wherein the conductive contact and the metal oxide layer comprise a same metal.

6 Claims, 20 Drawing Sheets

SEMICONDUCTOR DEVICE STRUCTURE WITH FINE CONDUCTIVE CONTACT AND METHOD FOR PREPARING THE SAME

TECHNICAL FIELD

The present disclosure relates to a semiconductor device structure and a method for preparing the same, and more particularly, to a semiconductor device structure with a fine conductive contact and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a dielectric layer disposed over a semiconductor substrate, and a first conductive contact penetrating through the dielectric layer. The first conductive contact includes a first metal filling layer and a first metal silicide structure surrounding the first metal filling layer. The semiconductor device structure also includes a second conductive contact penetrating through the dielectric layer. The second conductive contact includes a second metal filling layer and a second metal silicide structure surrounding the second metal filling layer, and a first width of the first conductive contact is different from a second width of the second conductive contact.

In some embodiments, the first metal filling layer is separated from the dielectric layer by the first metal silicide structure, and the second metal filling layer is separated from the dielectric layer by the second metal silicide structure. In some embodiments, the first metal filling layer is separated from the semiconductor substrate by the first metal silicide structure, and the second metal filling layer is separated from the semiconductor substrate by the second metal silicide structure. In some embodiments, a material of the first metal silicide structure is the same as a material of the second metal silicide structure. In some embodiments, a top surface of the first metal silicide structure is level with a top surface of the first metal filling layer, and a top surface of the second metal silicide structure is level with a top surface of the second metal filling layer. In some embodiments, the first metal silicide structure and the second metal silicide structure each comprise multiple sub-layers.

In another embodiment of the present disclosure, a semiconductor device structure is provided. The semiconductor device structure includes a dielectric layer disposed over a semiconductor substrate, and a conductive contact penetrating through the dielectric layer. The semiconductor device structure also includes a metal oxide layer separating the conductive contact from the dielectric layer. The conductive contact and the metal oxide layer include a same metal.

In some embodiments, the metal oxide layer is in direct contact with the conductive contact. In some embodiments, a bottom surface of the metal oxide layer is level with a bottom surface of the conductive contact. In some embodiments, a top surface of the metal oxide layer is level with a top surface of the conductive contact.

In one embodiment of the present disclosure, a semiconductor device structure is provided. The semiconductor device structure comprises a dielectric layer disposed over a semiconductor substrate; a first conductive contact penetrating through the dielectric layer, wherein the first conductive contact comprises a first metal filling layer and a first metal silicide structure surrounding the first metal filling layer; a second conductive contact penetrating through the dielectric layer, wherein the second conductive contact comprises a second metal filling layer and a second metal silicide structure surrounding the second metal filling layer, and wherein a first width of the first conductive contact is different from a second width of the second conductive contact; a first metal oxide layer separating the first conductive contact from the dielectric layer, wherein the first conductive contact and the first metal oxide layer comprise a same metal; and a second metal oxide layer separating the second conductive contact from the dielectric layer, wherein the second conductive contact and the second metal oxide layer comprise a same metal.

In some embodiments, the first metal filling layer is separated from the dielectric layer by the first metal silicide structure, and the second metal filling layer is separated from the dielectric layer by the second metal silicide structure.

In some embodiments, the first metal filling layer is separated from the semiconductor substrate by the first metal silicide structure, and the second metal filling layer is separated from the semiconductor substrate by the second metal silicide structure.

In some embodiments, a material of the first metal silicide structure is the same as a material of the second metal silicide structure.

In some embodiments, a top surface of the first metal silicide structure is level with a top surface of the first metal filling layer, and a top surface of the second metal silicide structure is level with a top surface of the second metal filling layer.

In some embodiments, the first metal silicide structure and the second metal silicide structure each comprise multiple sub-layers.

In another embodiment of the present disclosure, a method for preparing a semiconductor device structure is provided. The method includes forming a dielectric layer over a semiconductor substrate, and forming a first opening and a second opening penetrating through the dielectric layer. A first width of the first opening is different from a second width of the second opening. The method also includes forming a first metal silicide structure and a second metal silicide structure in the first opening and the second opening, respectively. The forming the first metal silicide structure and the second metal silicide structure includes forming a first silicon-containing layer and a second silicon-containing layer lining the first opening and the second opening, respectively, and transforming the first silicon-containing layer and the second silicon-containing layer into a first metal silicide layer and a second metal silicide layer, respectively. The method further includes filling a remaining portion of the first opening with a first metal filling layer and filling a remaining portion of the second opening with a second metal filling layer.

In some embodiments, the first silicon-containing layer and the second silicon-containing layer are formed by soaking the first opening and the second opening in silane. In some embodiments, a bottom surface and sidewalls of the first opening are covered by the first silicon-containing layer, and a bottom surface and sidewalls of the second opening are covered by the second silicon-containing layer. In some embodiments, the forming the first metal silicide structure and the second metal silicide structure further includes forming a third silicon-containing layer and a fourth silicon-containing layer over the first metal silicide layer and the second metal silicide layer, respectively, and transforming the third silicon-containing layer and the fourth silicon-containing layer into a third metal silicide layer and a fourth metal silicide layer, respectively. In some embodiments, the first metal filling layer is separated from the dielectric layer by the first metal silicide structure, and the second metal filling layer is separated from the dielectric layer by the second metal silicide structure.

In yet another embodiment of the present disclosure, a method for preparing a semiconductor device structure is provided. The method includes forming a sacrificial layer over a semiconductor substrate, and forming an opening penetrating through the sacrificial layer. The method also includes filling the opening with a metal pillar, and removing the sacrificial layer after the metal pillar is formed. The method further includes reducing a width of the metal pillar after the sacrificial layer is removed.

In some embodiments, the width of the metal pillar is reduced by performing an oxidation process, such that a portion of the metal pillar is transformed into a metal oxide layer. In some embodiments, the metal oxide layer covers a top surface and sidewalls of a remaining portion of the metal pillar. In some embodiments, the method further includes forming a dielectric layer covering the metal oxide layer, and performing a planarization process to expose the remaining portion of the metal pillar. In some embodiments, the method further includes removing the metal oxide layer to expose the remaining portion of the metal pillar, and forming a dielectric layer covering the remaining portion of the metal pillar. In addition, the method includes performing a planarization process to expose the remaining portion of the metal pillar.

Embodiments of a semiconductor device structure and method for preparing the same are provided in the disclosure. In some embodiments, the semiconductor device structure includes conductive contacts penetrating through a dielectric layer over a semiconductor substrate. Each of the conductive contacts includes a metal filling layer and a metal silicide structure surrounding the metal filling layer. In some embodiments, the conductive contacts have different widths. Since the conductive contacts with different widths may be formed in similar processing steps using similar materials, the method for preparing the semiconductor device structure is simple and the fabrication cost and time of the semiconductor device structure can be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
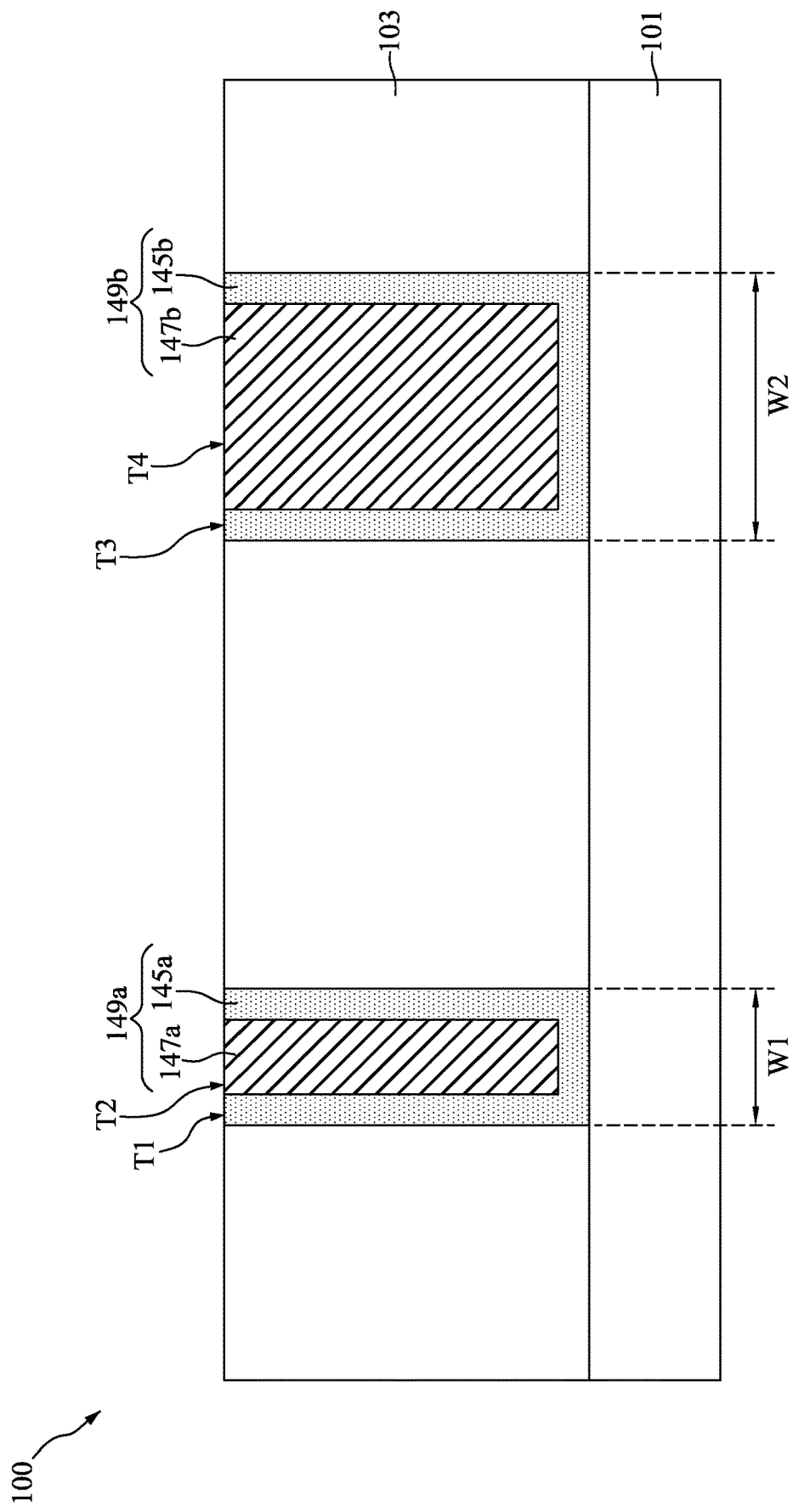
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100, in accordance with some embodiments. In some embodiments, the semiconductor device structure 100 includes a dielectric layer 103 disposed over a semiconductor substrate 101, and conductive contacts 149a and 149b disposed in the dielectric layer 103. In some embodiments, the conductive contacts 149a and 149b penetrate through the dielectric layer 103 to contact the semiconductor substrate 101.

In some embodiments, the conductive contact 149a includes a metal filling layer 147a and a metal silicide structure 145a surrounding the metal filling layer 147a, and the conductive contact 149b includes a metal filling layer 147b and a metal silicide structure 145b surrounding the metal filling layer 147b. In some embodiments, the metal filling layer 147a is separated from the dielectric layer 103 and the semiconductor substrate 101 by the metal silicide structure 145a, and the metal filling layer 147b is separated from the dielectric layer 103 and the semiconductor substrate 101 by the metal silicide structure 145b. In some embodiments, the metal filling layer 147a is in direct contact with the metal silicide structure 145a, and the metal filling layer 147b is in direct contact with the metal silicide structure 145b.

Moreover, in some embodiments, the top surface T1 of the metal silicide structure 145a of the conductive contact 149a is substantially level with the top surface T2 of the metal filling layer 147a of the conductive contact 149a, and the top surface T3 of the metal silicide structure 145b of the conductive contact 149b is substantially level with the top surface T4 of the metal filling layer 147b of the conductive contact 149b. Within the context of this disclosure, the word "substantially" means preferably at least 90%, more preferably 95%, even more preferably 98%, and most preferably 99%. In some embodiments, the conductive contact 149a has a width W1, the conductive contact 149b has a width W2, and the width W2 is greater than the width W1.

Figure 2:
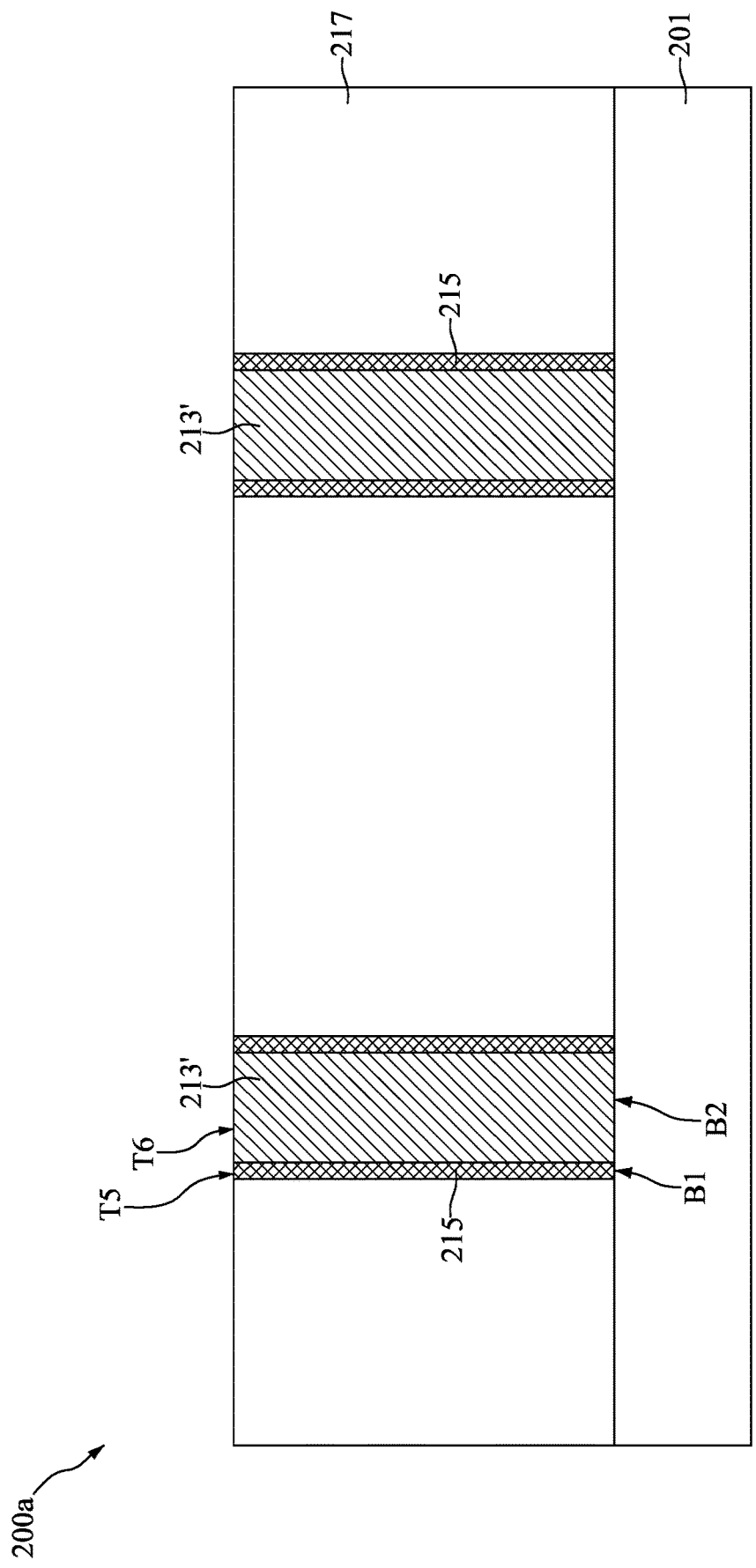
FIG. 2 is a cross-sectional view illustrating a semiconductor device structure, in accordance with some embodiments.

FIG. 2 is a cross-sectional view illustrating a semiconductor device structure 200a, in accordance with some embodiments. In some embodiments, the semiconductor device structure 200a includes a dielectric layer 217 disposed over a semiconductor substrate 201, and conductive contacts 213' disposed in the dielectric layer 217. Although FIG. 2 shows that the semiconductor device structure 200a includes two conductive contacts 213', the present disclosure is not limited thereto. In some embodiments, the semiconductor device structure 200a can have more, or fewer conductive contacts 213', depend on the functional requirements of the semiconductor device structure 200a.

Moreover, in some embodiments, the semiconductor device structure 200a also includes metal oxide layers 215 disposed between the conductive contacts 213' and the dielectric layer 217. In some embodiments, the conductive contacts 213' are separated from the dielectric layer 217 by the metal oxide layers 215. In some embodiments, the conductive contacts 213' and the metal oxide layers 215 include the same metal.

In some embodiments, the top surfaces T5 of the metal oxide layers 215 are substantially level with the top surfaces T6 of the conductive contacts 213'. In some embodiments, the bottom surfaces B1 of the metal oxide layers 215 are substantially level with the bottom surfaces B2 of the conductive contacts 213'. In some embodiments, conductive contacts 213' and the metal oxide layers 215 are in direct contact with the semiconductor substrate 201.

In some embodiments of the present disclosure, the semiconductor device structure 200a (shown in FIG. 1) may also include metal oxide layers (shown in FIG. 2) disposed between the conductive contacts and the dielectric layer, which is not repeated herein for clarity.

Figure 3:
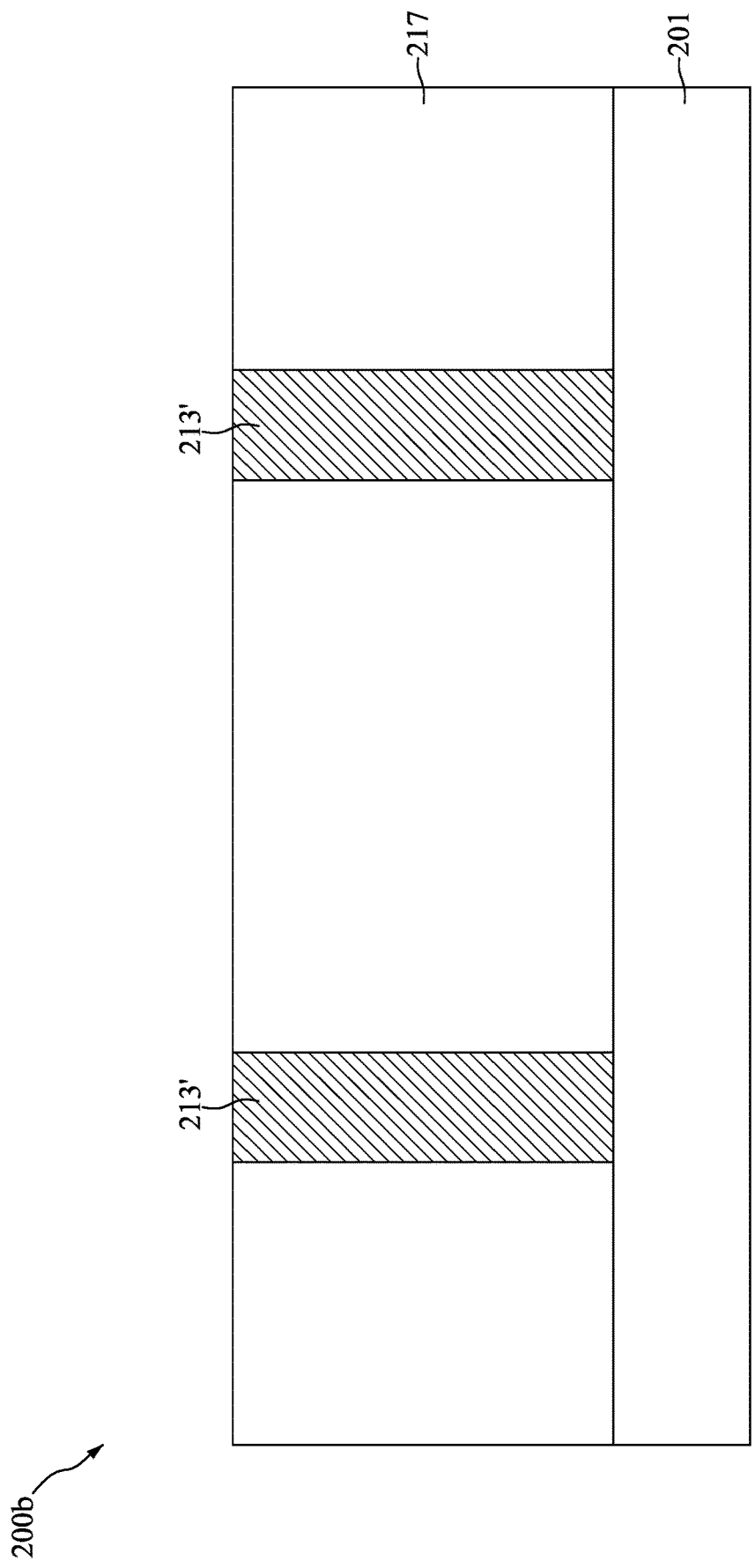
FIG. 3 is a cross-sectional view illustrating a semiconductor device structure, in accordance with some embodiments.

FIG. 3 is a cross-sectional view illustrating a semiconductor device structure 200b, in accordance with some embodiments. The semiconductor device structure 200b in FIG. 3 is similar to the semiconductor device structure 200a in FIG. 2. However, in FIG. 3, the metal oxide layers 215 are removed such that the conductive contacts 213' are in direct contact with the dielectric layer 217.

Figure 4:
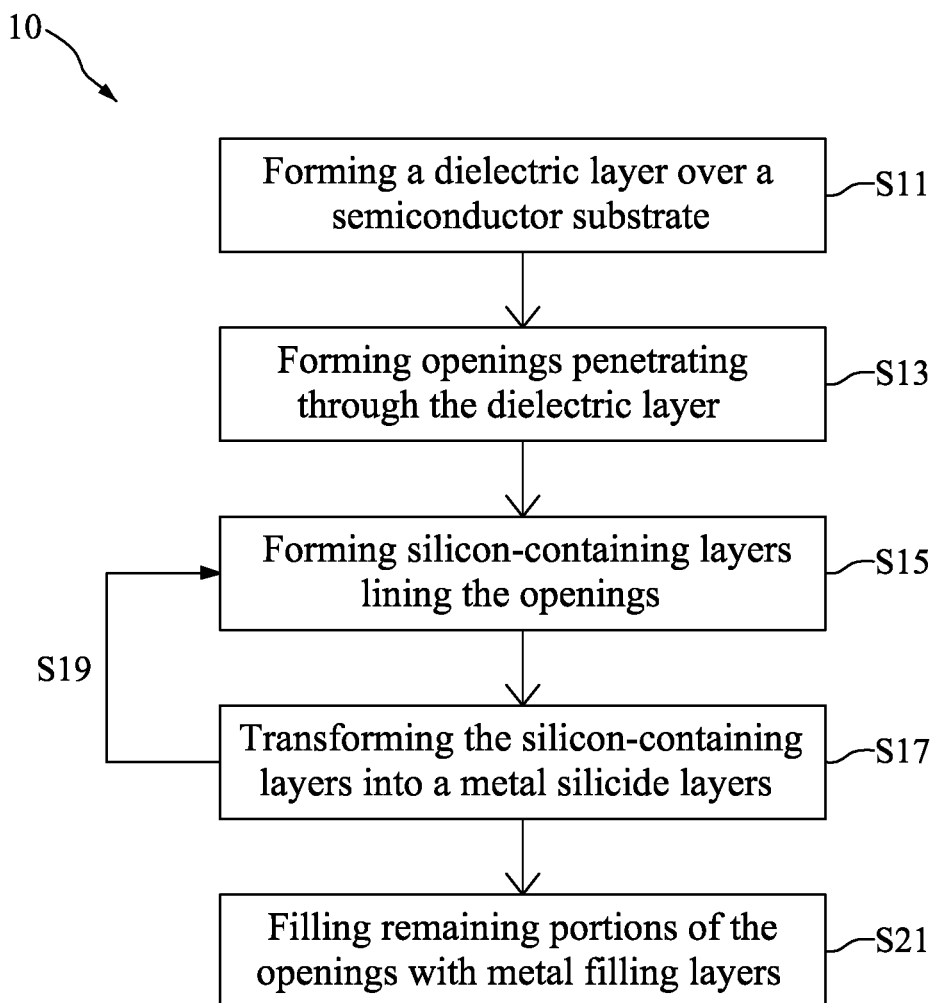
FIG. 4 is a flow diagram illustrating a method for preparing a semiconductor device structure, in accordance with some embodiments.
Figure 5:
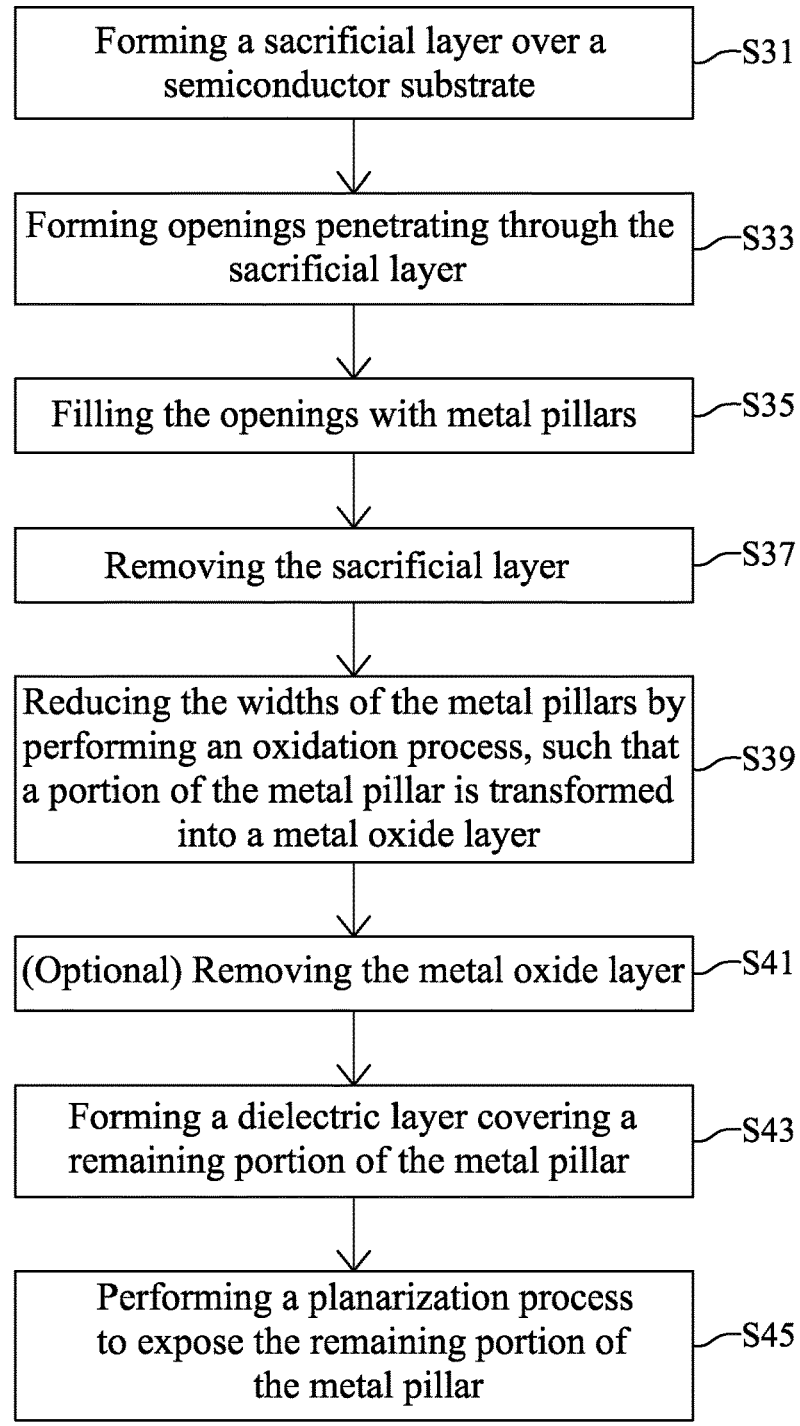
FIG. 5 is a flow diagram illustrating a method for preparing a semiconductor device structure, in accordance with some embodiments.

FIG. 4 is a flow diagram illustrating a method 10 for forming a semiconductor device structure, such as the semiconductor device structure 100 shown in FIG. 1, and the method 10 includes steps S11, S13, S15, S17, S19 and S21, in accordance with some embodiments. FIG. 5 is a flow diagram illustrating a method 30 for forming a semiconductor device structure, such as the semiconductor device structures 200a and 200b shown in FIGS. 2 and 3, and the method 30 includes steps S31, S33, S35, S37, S39, S41, S43 and S45, in accordance with some embodiments. The steps S11 to S21 of FIG. 4 and the steps S31 to S45 of FIG. 5 are elaborated in connection with the following figures.

Figure 6:
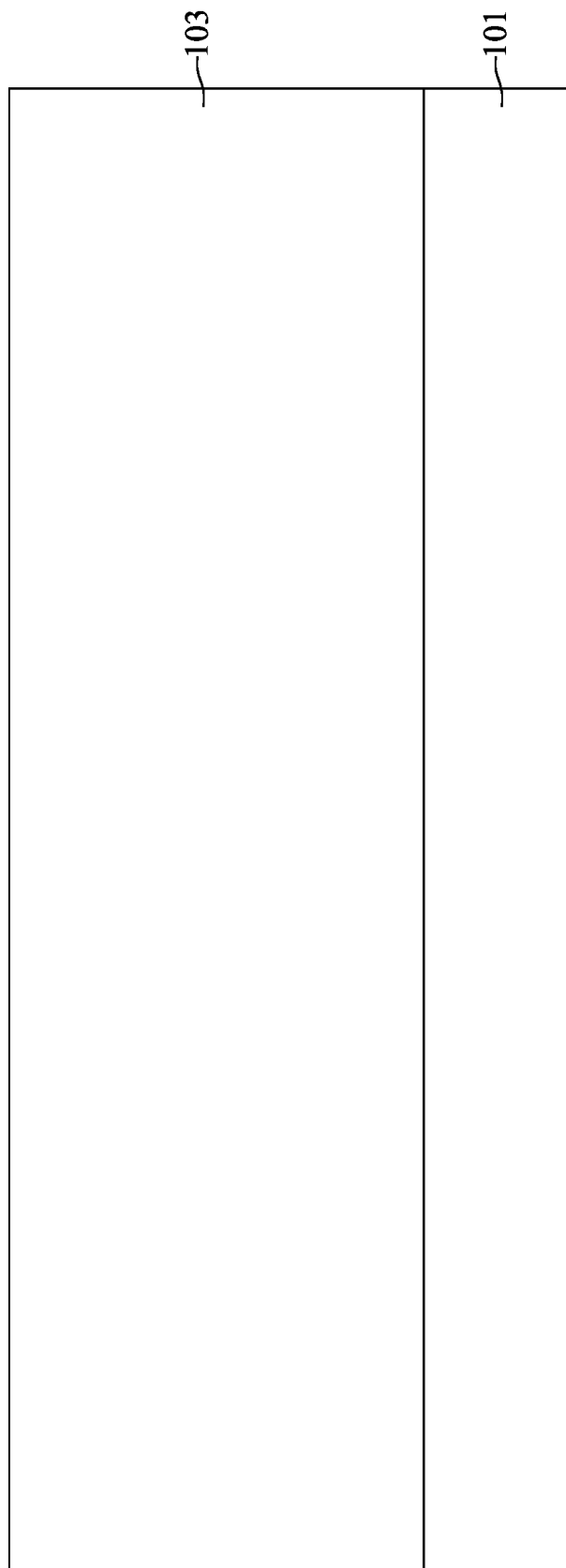
FIG. 6 is a cross-sectional view illustrating an intermediate stage of forming a dielectric layer over a semiconductor substrate during the formation of the semiconductor device structure, in accordance with some embodiments.

FIGS. 6-14 are cross-sectional views illustrating various stages of forming the semiconductor device structure 100 by the method 10 of FIG. 4 according to various embodiments of the present disclosure. As shown in FIG. 6, a semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A dielectric layer 103 is formed over the semiconductor substrate 101, as shown in FIG. 6 in accordance with some embodiments. The respective step is illustrated as the step S11 in the method 10 shown in FIG. 4. In some embodiments, the dielectric layer 103 is made of silicon oxide, silicon nitride, silicon oxynitride, a low-k dielectric material or another suitable material. The dielectric layer 103 may be formed by a deposition process, such as a chemical vapor deposition (CVD) process, a physical vapor deposition (PVD) process, an atomic layer deposition (ALD) process, a spin-on coating process, or another suitable method.

Figure 7:
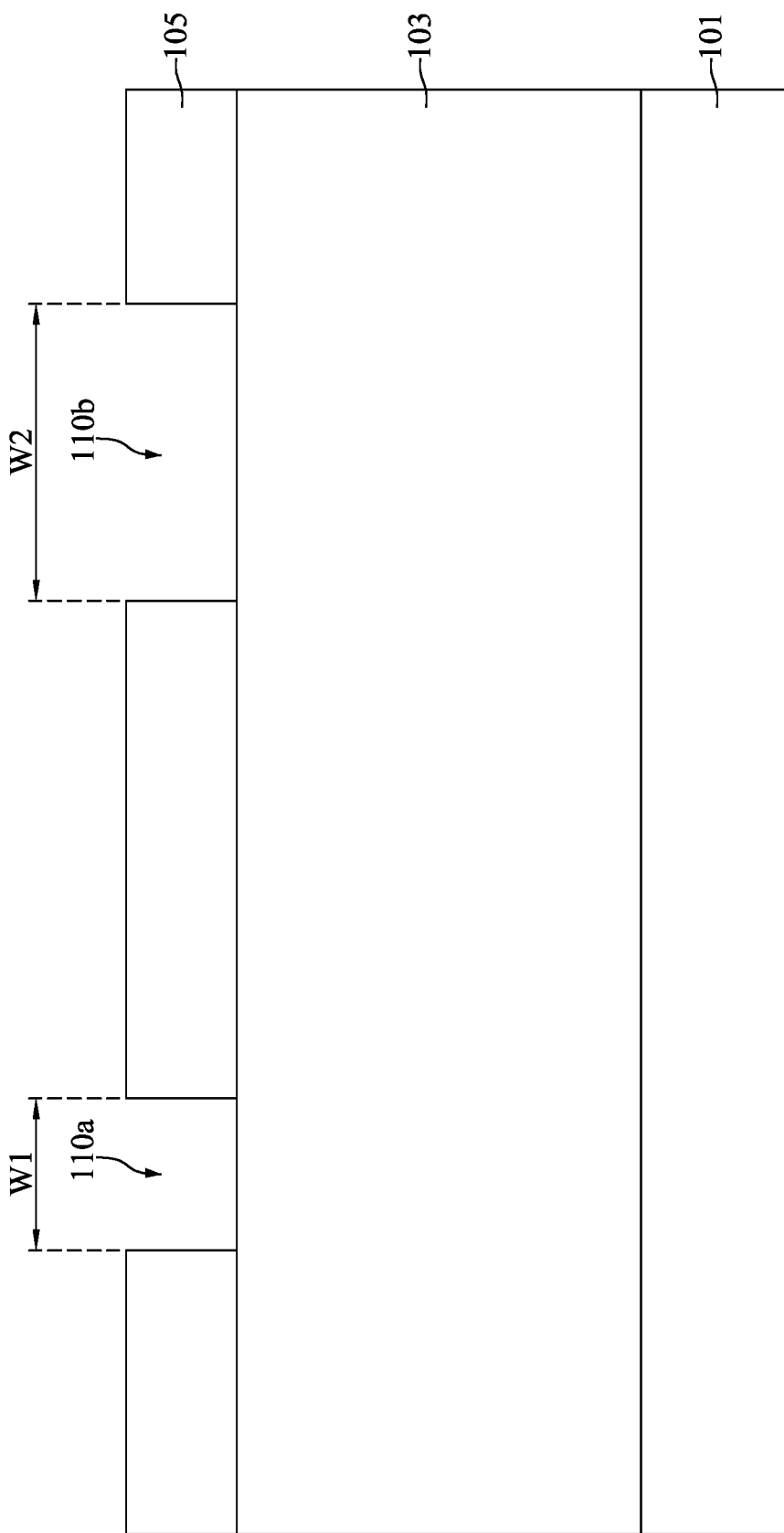
FIG. 7 is a cross-sectional view illustrating an intermediate stage of forming a patterned mask over the dielectric layer during the formation of the semiconductor device structure, in accordance with some embodiments.

Subsequently, a patterned mask 105 with openings 110a and 110b is formed over the dielectric layer 103, as shown in FIG. 7 in accordance with some embodiments. In some embodiments, the dielectric layer 103 is exposed by the openings 110a and 110b. In some embodiments, the width W1 of the opening 110a is substantially equal to the width W1 of the conductive contact 149a (see FIG. 1). Hence, the width W1 of the opening 110a and the width W1 of the conductive contact 149a are denoted by the same reference sign. Moreover, the width W2 of the opening 110b is substantially equal to the width W2 of the conductive contact 149b (see FIG. 1). Hence, the width W2 of the opening 110b and the width W2 of the conductive contact 149b are denoted by the same reference sign. In some embodiments, the widths W2 of the opening 110b in the patterned mask 105 is greater than the width W1 of the opening 110a in the patterned mask 105.

Figure 8:
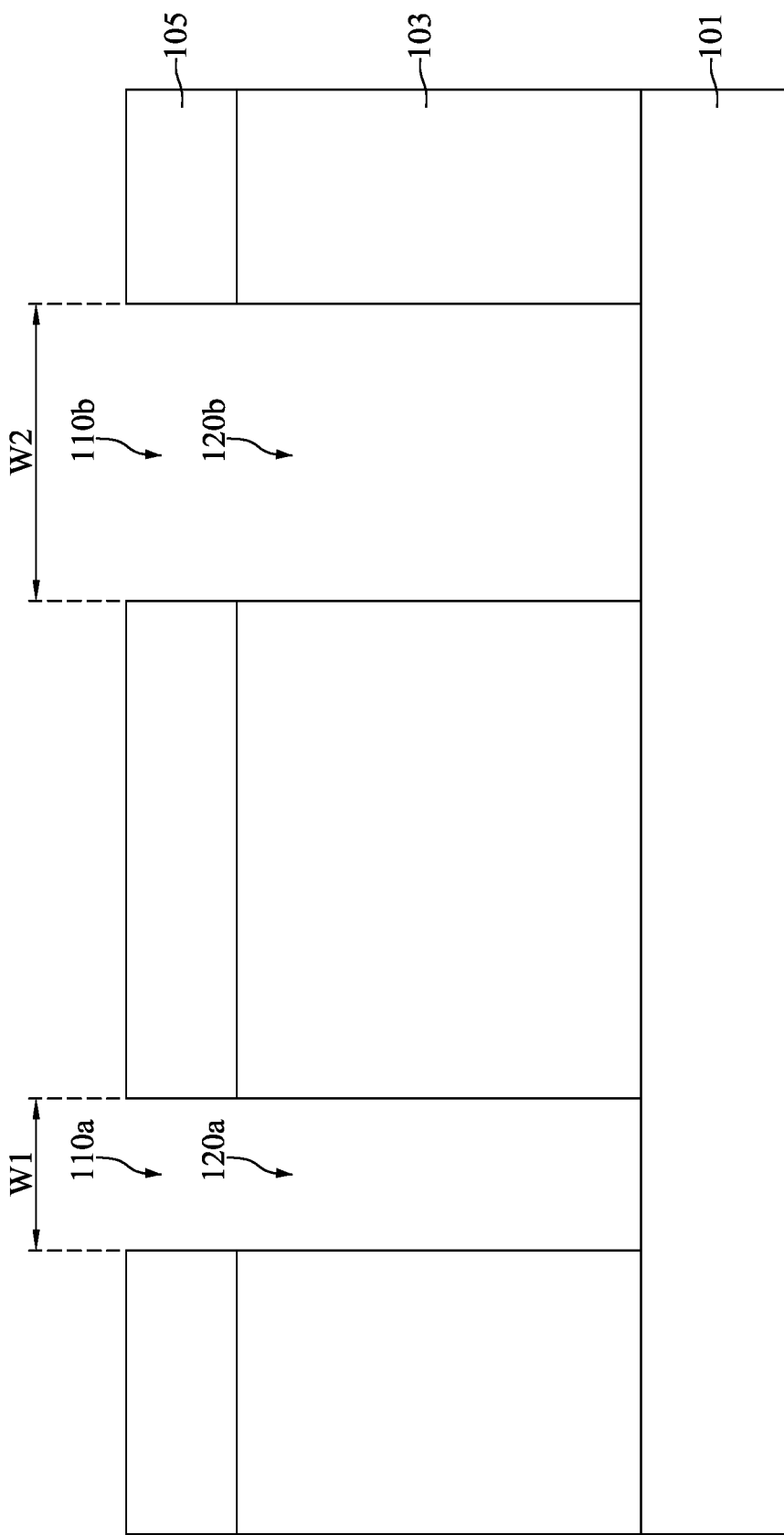
FIG. 8 is a cross-sectional view illustrating an intermediate stage of etching the dielectric layer to form openings during the formation of the semiconductor device structure, in accordance with some embodiments.

Then, an etching process is performed on the dielectric layer 103 using the patterned mask 105 as an etching mask, such that openings 120a and 120b are formed in the dielectric layer 103, as shown in FIG. 8 in accordance with some embodiments. The etching process may be a wet etching process, a dry etching process, and a combination thereof. In some embodiments, the width of the opening 120a is substantially equal to the width W1 of the opening 110a, and the width of the opening 120b is substantially equal to the width W2 of the opening 110b. Therefore, the width of the opening 120b is greater than the width of the opening 120a. In addition, the openings 120a and 120b penetrate through the dielectric layer 103, such that the semiconductor substrate 101 is exposed by the openings 120a and 120b, in accordance with some embodiments. The respective step is illustrated as the step S13 in the method 10 shown in FIG. 4.

Figure 9:
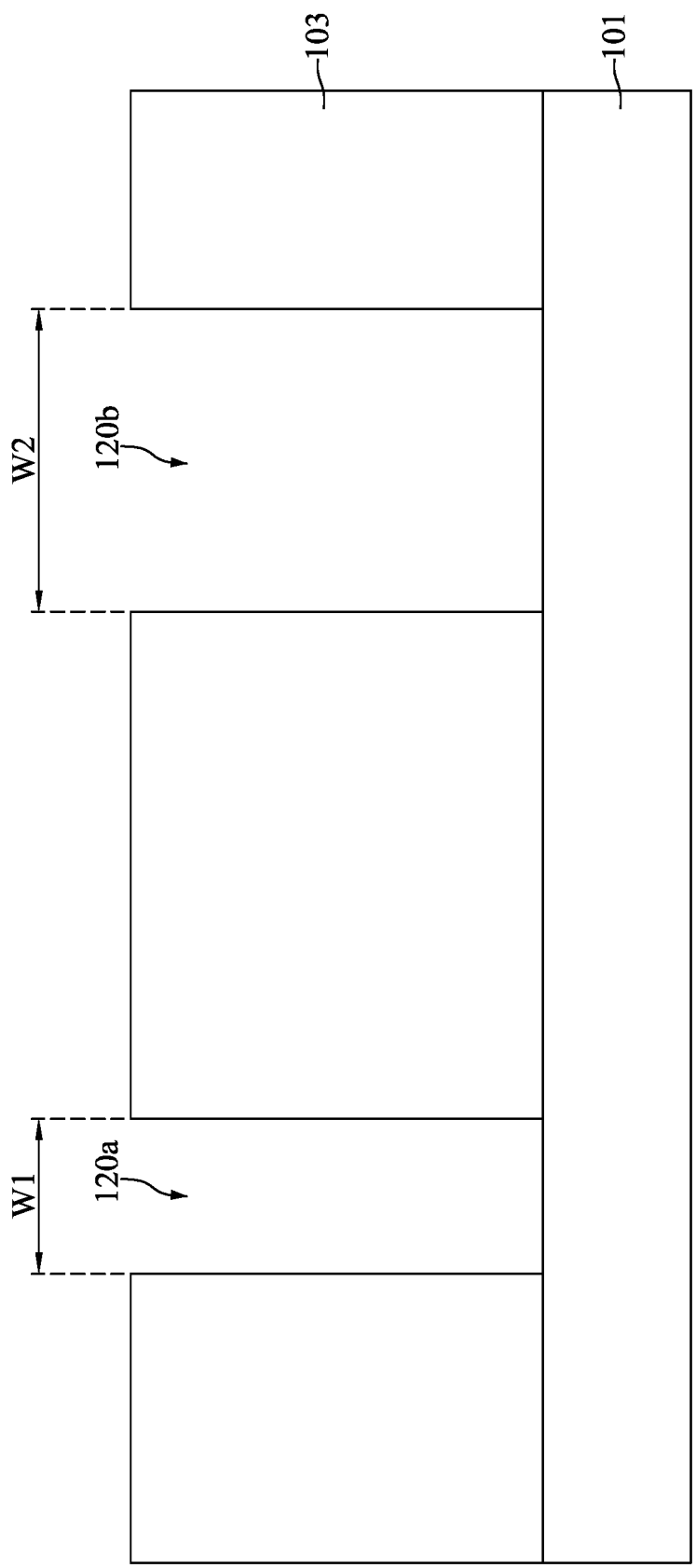
FIG. 9 is a cross-sectional view illustrating an intermediate stage of removing the patterned mask during the formation of the semiconductor device structure, in accordance with some embodiments.

After the openings 120a and 120b are formed in the dielectric layer 103, the patterned mask 105 is removed, as shown in FIG. 9 in accordance with some embodiments. In some embodiments, the patterned mask 105 is removed by a stripping process, an ashing process, an etching process, or another suitable process.

Figure 10:
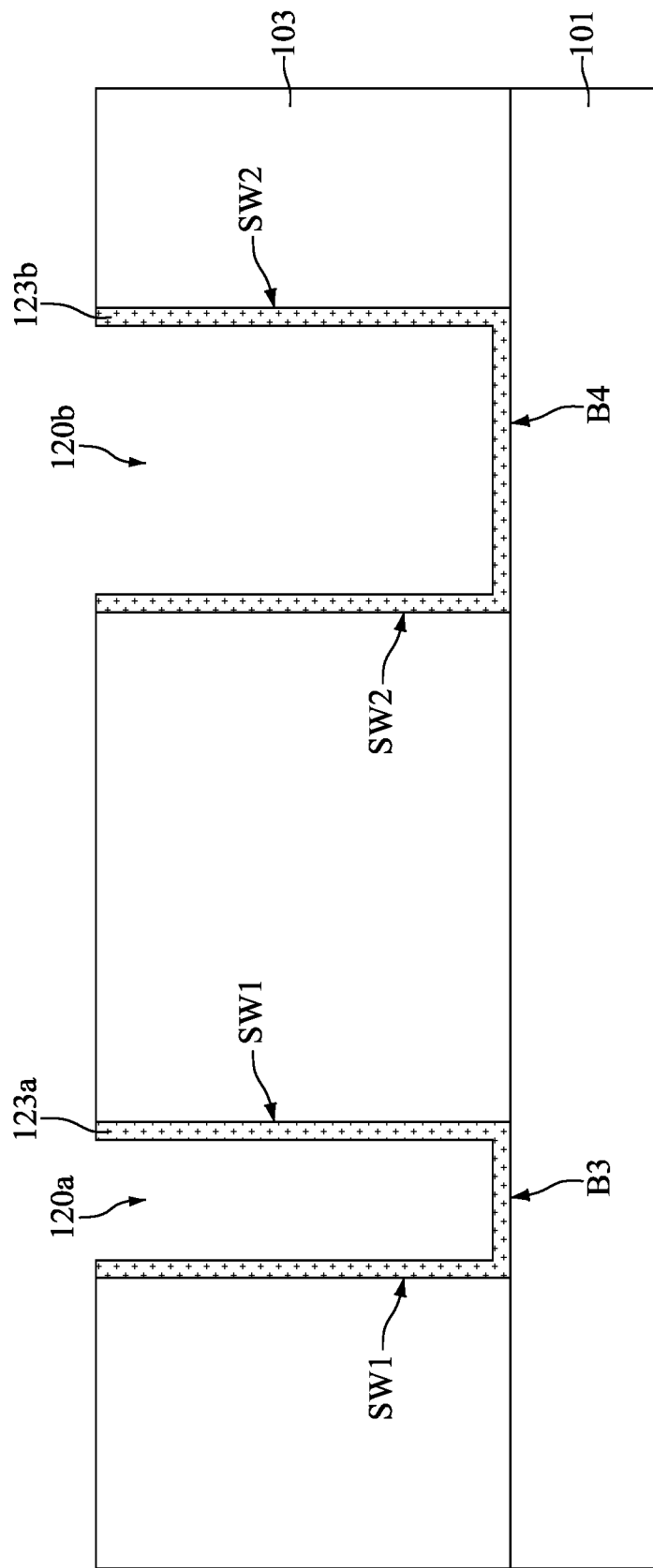
FIG. 10 is a cross-sectional view illustrating an intermediate stage of forming silicon-containing layers lining the openings during the formation of the semiconductor device structure, in accordance with some embodiments.

Next, silicon-containing layers 123a and 123b are formed lining the openings 120a and 120b, respectively, as shown in FIG. 10 in accordance with some embodiments. The respective step is illustrated as the step S15 in the method 10 shown in FIG. 4. In some embodiments, the silicon containing layer 123a covers the sidewalls SW1 and the bottom surface B3 of the opening 120a, and the silicon containing layer 123b covers the sidewalls SW2 and the bottom surface B4 of the opening 120b.

In some embodiments, the silicon-containing layers 123a and 123b are formed by soaking the openings 120a and 120b in at least one silicon-containing precursor, such as silane ($SiH_4$), disilane ($Si_2H_6$), trisilane ($Si_3H_8$), dichlorosilane ($SiH_2Cl_2$), another silicon-containing precursor, or a combination thereof. It should be noted that the openings 120a and 120b are not fully filled by the silicon-containing layers 123a and 123b, in accordance with some embodiments.

Figure 11:
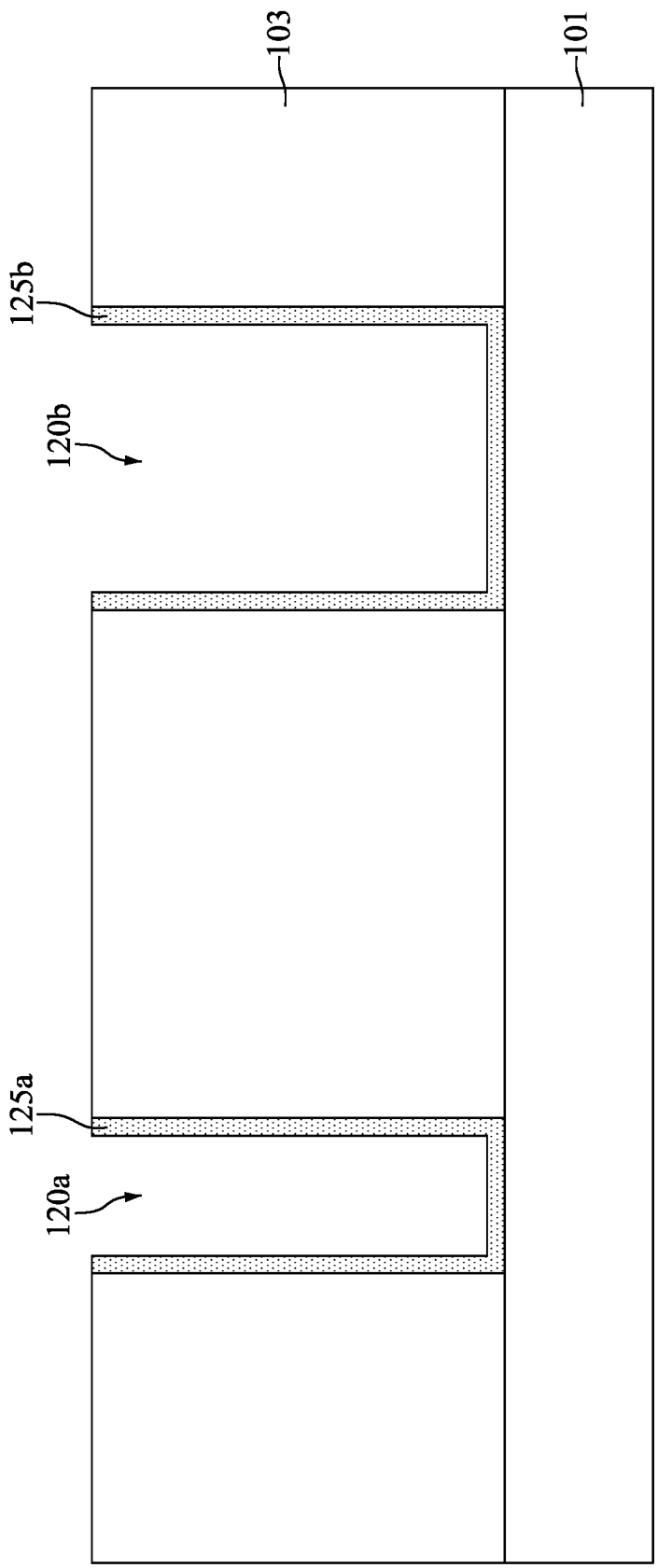
FIG. 11 is a cross-sectional view illustrating an intermediate stage of transforming the silicon-containing layers into metal silicide layers during the formation of the semiconductor device structure, in accordance with some embodiments.

Subsequently, the silicon-containing layers 123a and 123b are transformed into metal silicide layers 125a and 125b, as shown in FIG. 11 in accordance with some embodiments. The respective step is illustrated as the step S17 in the method 10 shown in FIG. 4. In some embodiments, the silicon-containing layers 123a and 123b are transformed into metal silicide layers 125a and 125b by forming a metal material (not shown) over the silicon-containing layers 123a and 123b and thereafter performing an annealing process to react the metal material with the silicon-containing layers 123a and 123b.

In some embodiments, the metal material includes nickel (Ni), titanium (Ti), cobalt (Co), tantalum (Ta), platinum (Pt), ytterbium (Yb), molybdenum (Mo), erbium (Er), or a combination thereof. In some embodiments, the metal silicide layers 125a and 125b include nickel silicide (NiSi), titanium silicide (TiSi), cobalt silicide (CoSi), tantalum silicide (TaSi), or a silicide material of a suitable metal material.

Figure 12:
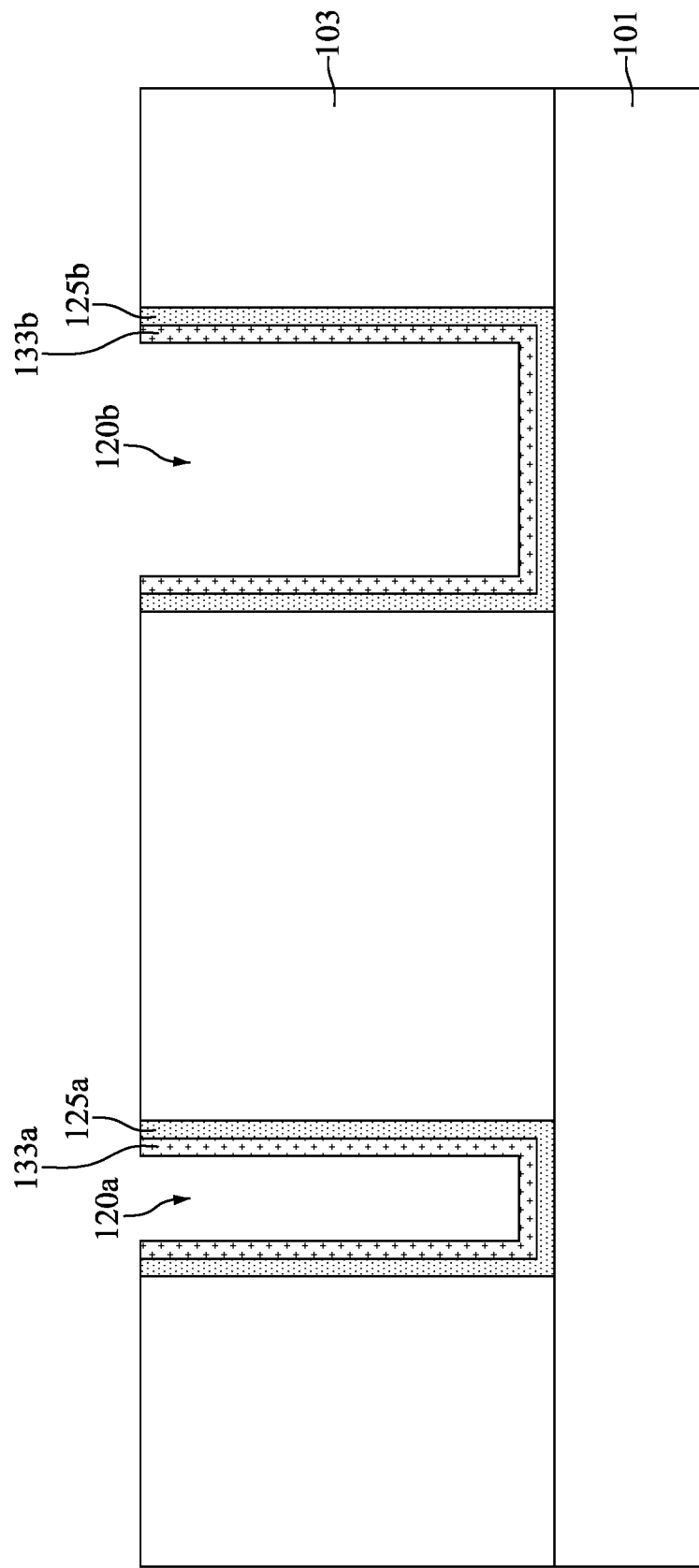
FIG. 12 is a cross-sectional view illustrating an intermediate stage of repeating the step of forming silicon-containing layers during the formation of the semiconductor device structure, in accordance with some embodiments.
Figure 13:
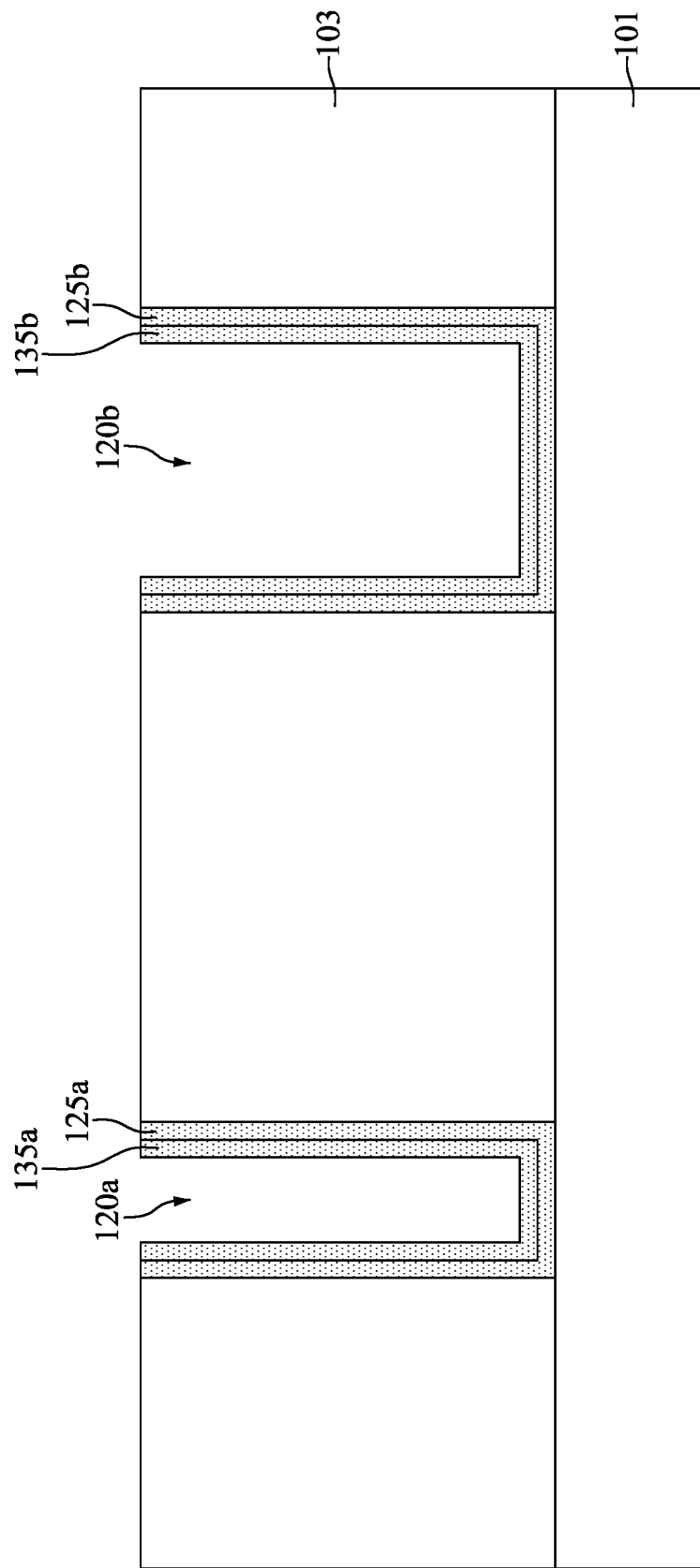
FIG. 13 is a cross-sectional view illustrating an intermediate stage of repeating the step of transforming the silicon-containing layers into metal silicide layers during the formation of the semiconductor device structure, in accordance with some embodiments.

In some embodiments, the metal silicide structures 145a and 145b shown in FIG. 1 are obtained after the metal silicide layers 125a and 125b are formed. In these cases, the process may proceed directly from the step S17 to the step S21. In some embodiments, the steps S15 and S17 are sequentially repeated to form the metal silicide structures 145a and 145b, as indicated by the directional process arrow S19. In these cases, silicon-containing layers 133a and 133b are formed over the silicide layers 125a and 125b, as shown in FIG. 12 in accordance with some embodiments. Some processes used to form the silicon-containing layers 133a and 133b are similar to, or the same as those used to form the silicon-containing layers 123a and 123b, and details thereof are not repeated herein. After the silicon-containing layers 133a and 133b are formed, the silicon-containing layers 133a and 133b are transformed into metal silicide layers 135a and 135b, as shown in FIG. 13 in accordance with some embodiments. Some materials and processes used to form the metal silicide layers 135a and 135b are similar to, or the same as those used to form the metal silicide layers 125a and 125b, and details thereof are not repeated herein.

Figure 14:
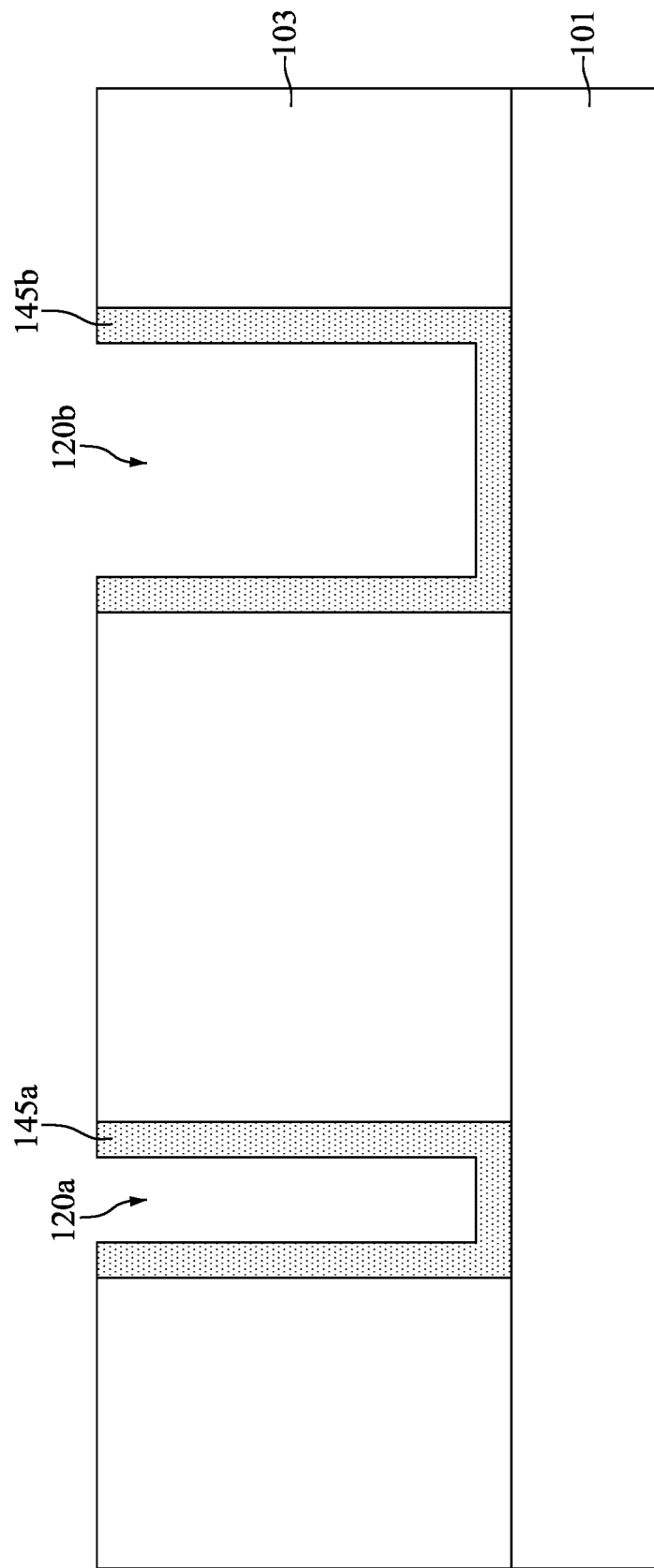
FIG. 14 is a cross-sectional view illustrating an intermediate stage of forming metal silicide structures during the formation of the semiconductor device structure, in accordance with some embodiments.

The steps S15 and S17 can be repeated multiple times, depend on the functional requirements of the semiconductor device structure 100. In other words, each of the metal silicide structures 145a and 145b may include multiple sub-layers, such as the metal silicide layers 125a, 125b, 135a and 135b, in accordance with some embodiments. The metal silicide structures 145a and 145b formed in the openings 120a and 120b are shown in FIG. 14 in accordance with some embodiments. It should be noted that the openings 120a and 120b are not fully filled by the metal silicide structures 145a and 145b, in accordance with some embodiments.

Then, the remaining portions of the openings 120a and 120b are filled with metal filling layers 147a and 147b, respectively, as shown in FIG. 1 in accordance with some embodiments. The respective step is illustrated as the step S21 in the method 10 shown in FIG. 4. In some embodiments, the metal filling layers 147a and 147b may be formed simultaneously in the same process steps. For example, the metal filling layers 147a and 147b may be formed by a deposition process and a subsequent planarization process. The deposition process may include a CVD process, a PVD process, an ALD process, a spin-on coating process, another suitable method, or a combination thereof. The planarization process may include a chemical mechanical polishing (CMP) process.

In some embodiments, the metal filling layers 147a and 147b may be formed separately by different steps. For example, the metal filling layer 147b is formed after the metal filling layer 147a. In addition, the metal filling layers 147a and 147b are made of a conductive material, such as copper (Cu), tungsten (W), aluminum (Al), titanium (Ti), tantalum (Ta), gold (Au), silver (Ag), in accordance with some embodiments. After the metal filling layers 147a and 147b are formed, the semiconductor device structure 100 having conductive contacts 149a and 149b with different widths is obtained.

Figure 15:
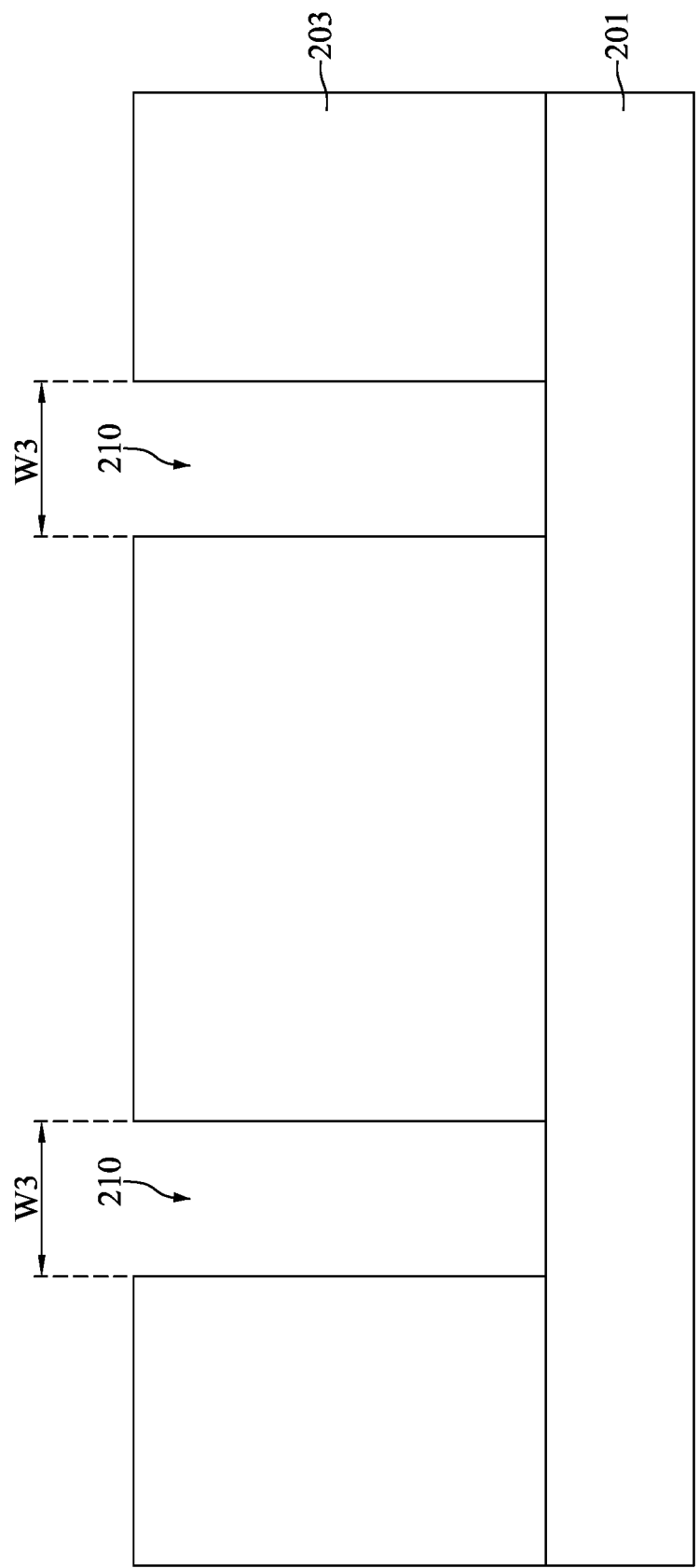
FIG. 15 is a cross-sectional view illustrating an intermediate stage of forming openings in a sacrificial layer over a semiconductor substrate during the formation of the semiconductor device structure, in accordance with some embodiments.

FIGS. 15-19 are cross-sectional views illustrating various stages of forming the semiconductor device structure 200a by the method 30 of FIG. 5 according to various embodiments of the present disclosure. As shown in FIG. 15, a semiconductor substrate 201, similar to the semiconductor substrate 101 of the semiconductor device structure 100, is provided, and a sacrificial layer 203 is formed over the semiconductor substrate 201, in accordance with some embodiments. In some embodiments, the sacrificial layer 203 has openings 210 exposing the semiconductor substrate 201.

In some embodiments, the sacrificial layer 203 is made of a dielectric material. For example, the sacrificial layer 203 includes silicide oxide, silicide nitride, silicon oxynitride, a low-k dielectric material or another suitable material. The sacrificial layer 203 may be formed by a deposition process, such as a CVD process, a PVD process, an ALD process, a spin-on coating process, or another suitable method. In addition, each of the openings 210 penetrating through the sacrificial layer 203 has a width W3. The openings 210 in the sacrificial layer 203 may be formed by an etching process, such as a wet etching process, a dry etching process, and a combination thereof. The respective steps are illustrated as the steps S31 and S33 in the method 30 shown in FIG. 5.

Figure 16:
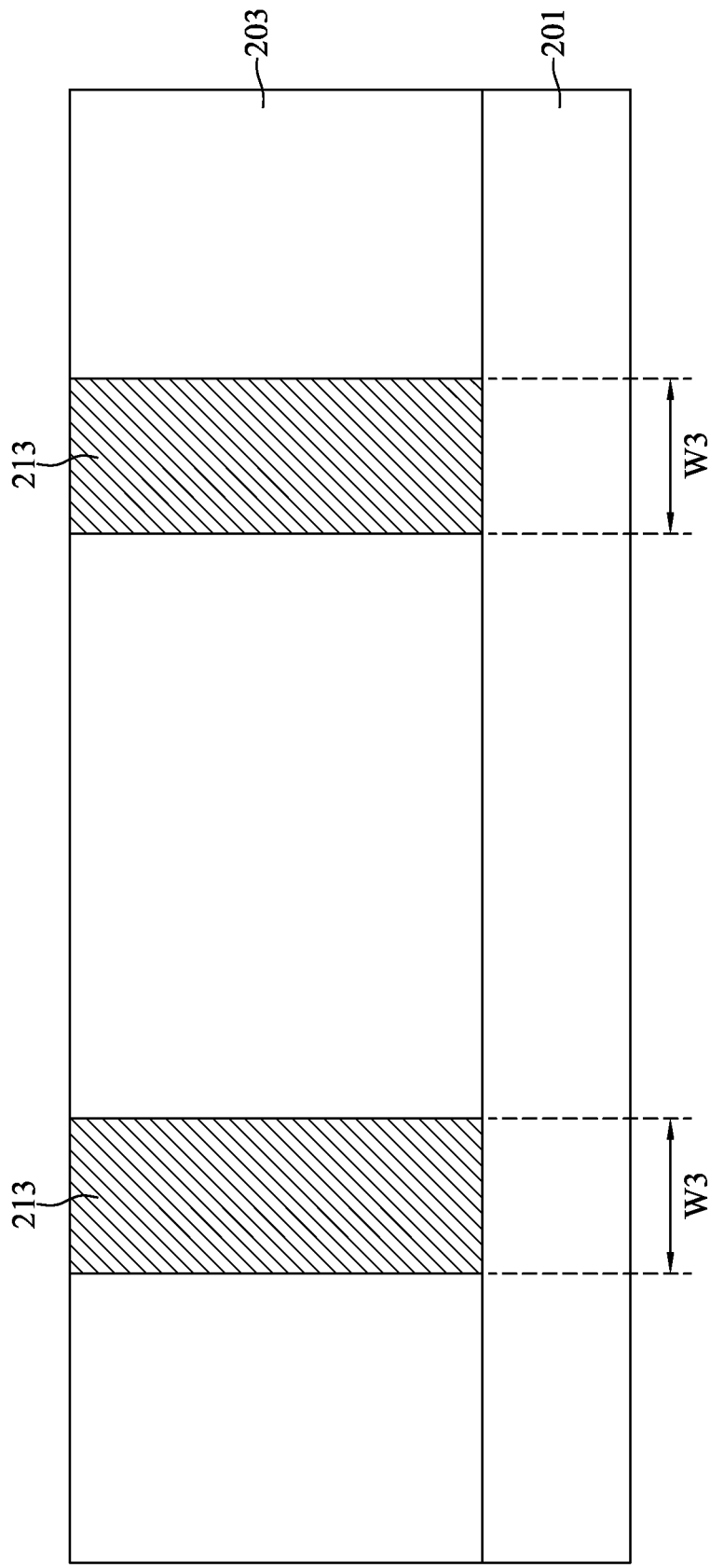
FIG. 16 is a cross-sectional view illustrating an intermediate stage of filling the openings with metal pillars during the formation of the semiconductor device structure, in accordance with some embodiments.

Next, the openings 210 are filled with metal pillars 213, as shown in FIG. 16 in accordance with some embodiments. The respective step is illustrated as the step S35 in the method 30 shown in FIG. 5. In some embodiments, the widths of the metal pillars 213 are substantially equal to the widths W3 of the openings 210. In some embodiments, the metal pillars 213 include a conductive material such as aluminum (Al), copper (Cu), tungsten (W), titanium (Ti), tantalum (Ta), or a combination thereof. In some embodiments, the metal pillars 213 are formed by a deposition process and a subsequent planarization process. The deposition process includes a CVD process, a PVD process, an ALD process, a sputtering process, a plating process, another suitable method, or a combination thereof. The planarization process includes a CMP process.

Figure 17:
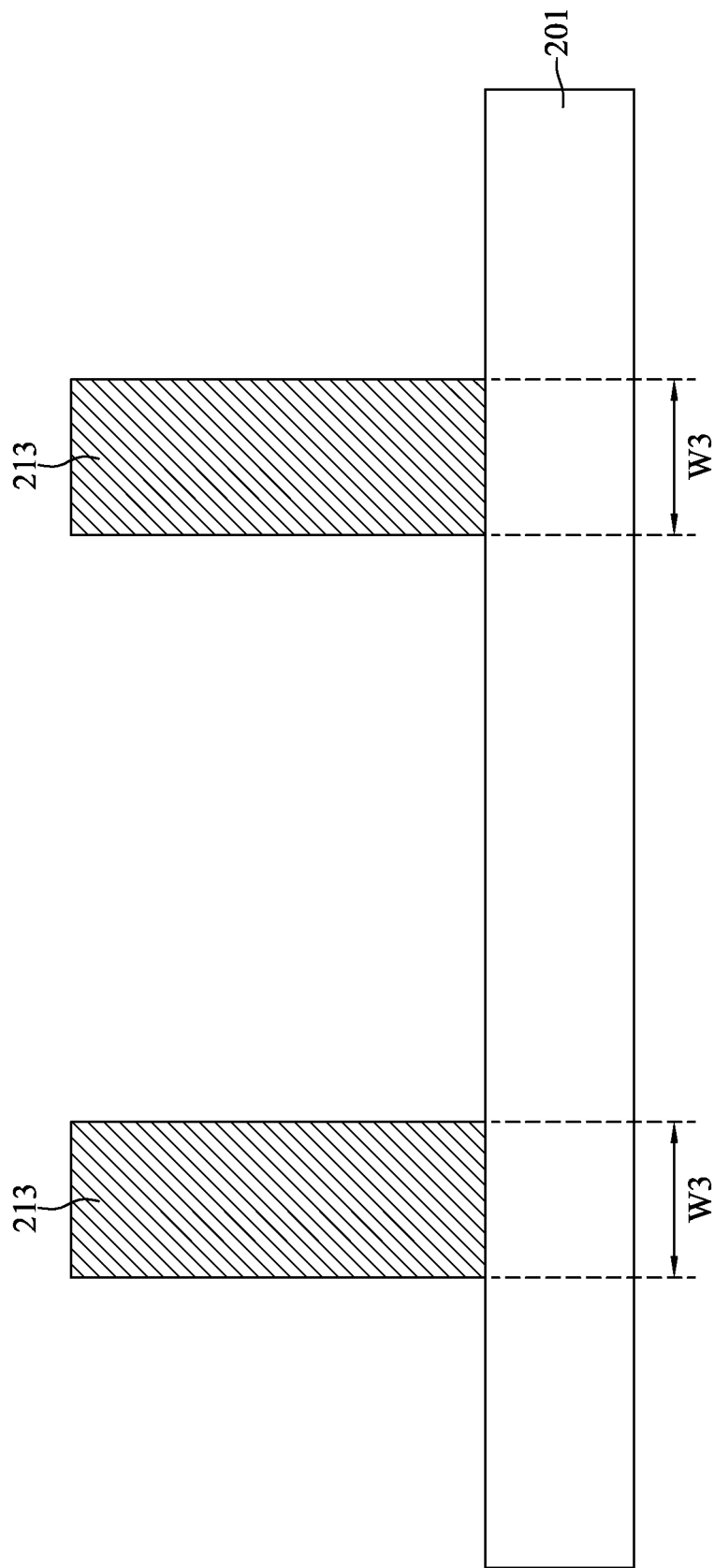
FIG. 17 is a cross-sectional view illustrating an intermediate stage of removing the sacrificial layer during the formation of the semiconductor device structure, in accordance with some embodiments.

After the metal pillars 213 are formed, the sacrificial layer 203 is removed, as shown in FIG. 17 in accordance with some embodiments. The respective step is illustrated as the step S37 in the method 30 shown in FIG. 5. In some embodiments, the sacrificial layer 203 is removed by an etching process, a stripping process, an ashing process, or another suitable process. After the sacrificial layer 203 is removed, the metal pillars 213 are protruded from the top surface of the semiconductor substrate 201.

Figure 18:
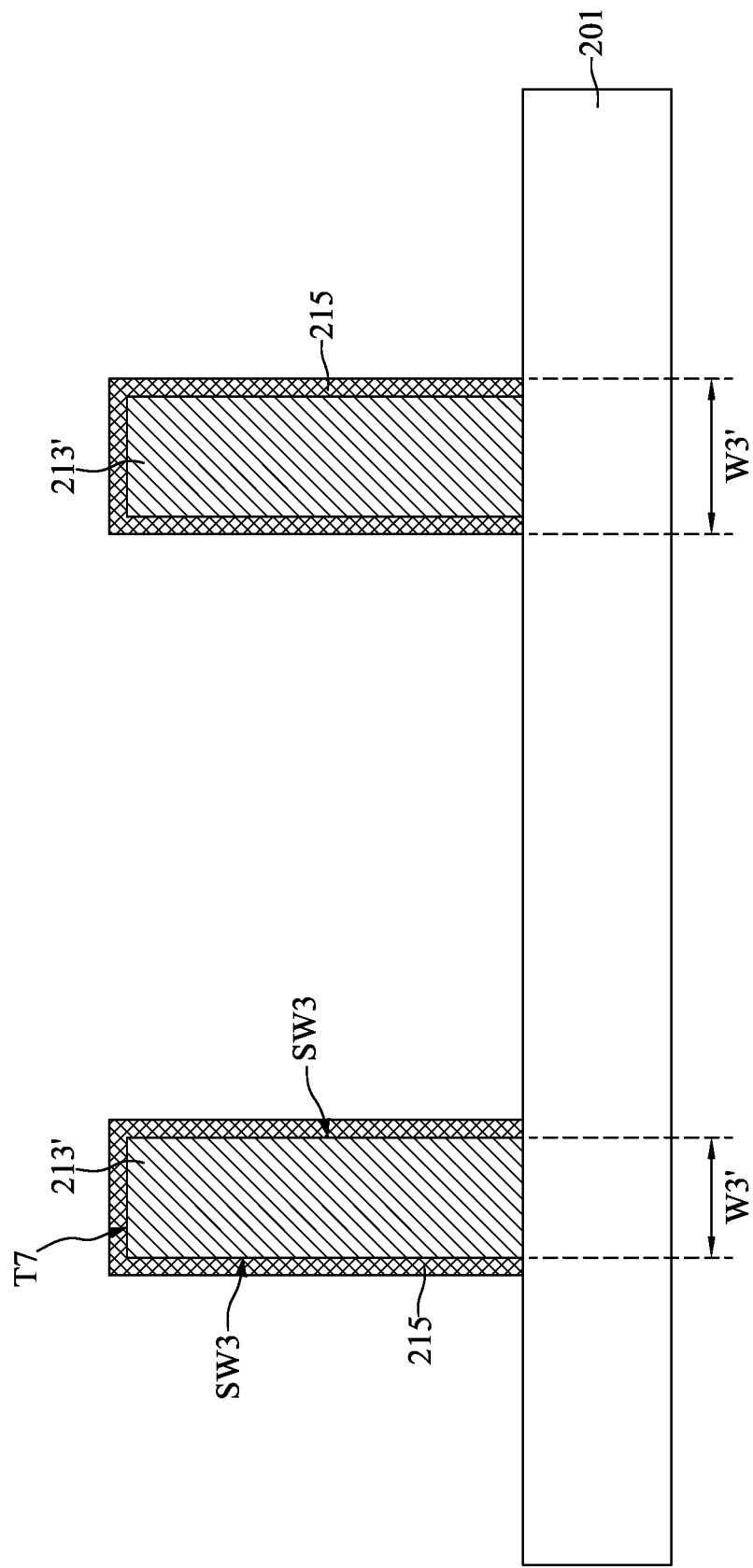
FIG. 18 is a cross-sectional view illustrating an intermediate stage of performing an oxidation process to transform portions of the metal pillars into metal oxide layers during the formation of the semiconductor device structure, in accordance with some embodiments.

Subsequently, the widths of the metal pillars 213 (i.e., the widths W3) are reduced, as shown in FIG. 18 in accordance with some embodiments. In some embodiments, the widths of the metal pillars 213 are reduced by performing an oxidation process, such that portions of the metal pillars 213 are transformed into metal oxide layers 215, and the remaining portions of the metal pillars 213' (also referred to as conductive contacts) are obtained. The respective step is illustrated as the step S39 in the method 30 shown in FIG. 5.

In some embodiments, the resulting widths W3' of the remaining portions of the metal pillars 213' are less than the original widths W3 of the metal pillars 213. In some embodiments, the outer portions of the metal pillars 213 (i.e., the top portions and the sidewall portions of the metal pillars 213) are transformed into the metal oxide layers 215.

As a result, the metal oxide layers 215 are formed over the sidewalls SW3 and the top surface T7 of the remaining portions of the metal pillars 213', in accordance with some embodiments.

Figure 19:
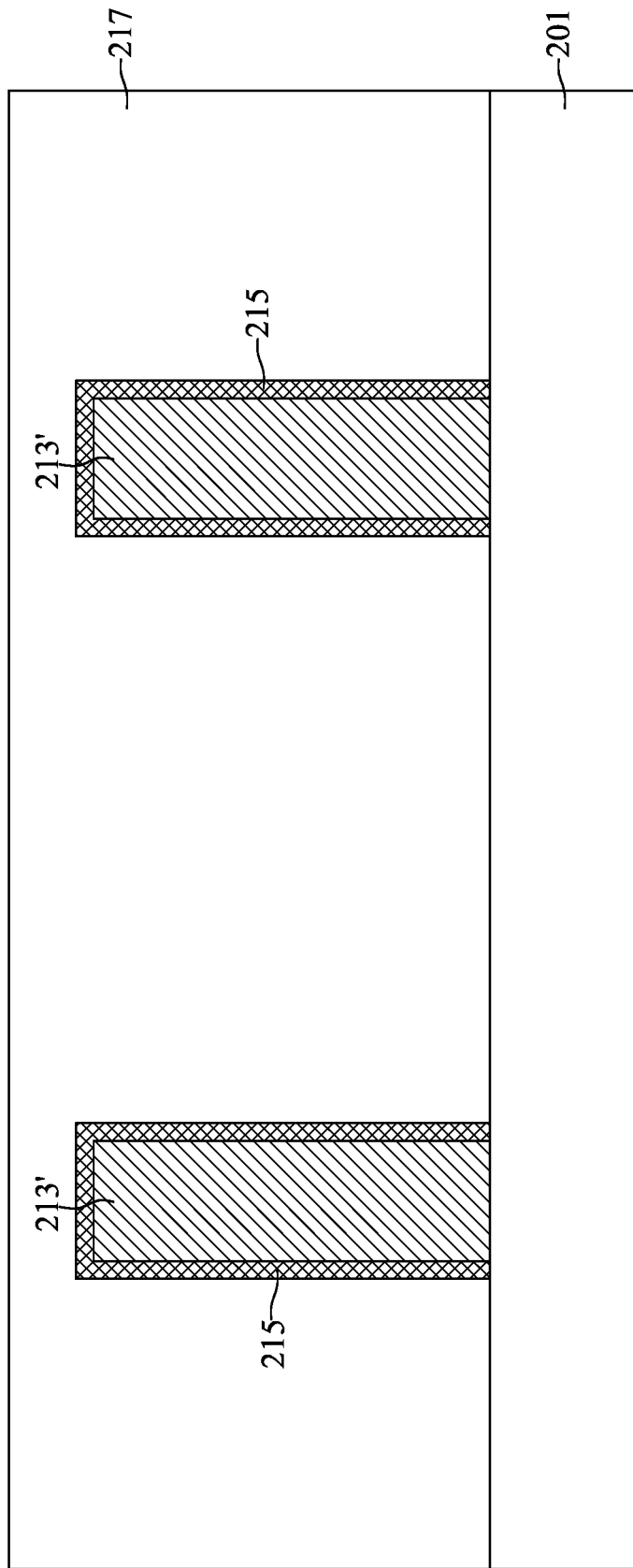
FIG. 19 is a cross-sectional view illustrating an intermediate stage of forming a dielectric layer over the metal oxide layers during the formation of the semiconductor device structure, in accordance with some embodiments.

The step S41 of removing the metal oxide layers 215 is optional. In the embodiments for forming the semiconductor device structure 200a, the step S41 is skipped after the metal oxide layers 215 are formed, and a dielectric layer 217 is formed covering the metal oxide layers 215 and the remaining portions of the metal pillars 213', as shown in FIG. 19 in accordance with some embodiments. The respective step is illustrated as the step S43 in the method 30 shown in FIG. 5. In some embodiments, the dielectric layer 217 is made of silicon oxide, silicon nitride, silicon oxynitride, a low-k dielectric material or another suitable material. The dielectric layer 217 may be formed by a deposition process, such as a CVD process, a PVD process, an ALD process, a spin-on coating process, or another suitable method.

Then, a planarization process is performed to remove excess portions of the dielectric layer 217 and the metal oxide layers 215, such that the remaining portions of the metal pillars 213' are exposed, as shown in FIG. 2 in accordance with some embodiments. The respective step is illustrated as the step S45 in the method 30 shown in FIG. 5. The planarization process may include a CMP process. After the planarization process is performed, the semiconductor device structure 200a is obtained.

Figure 20:
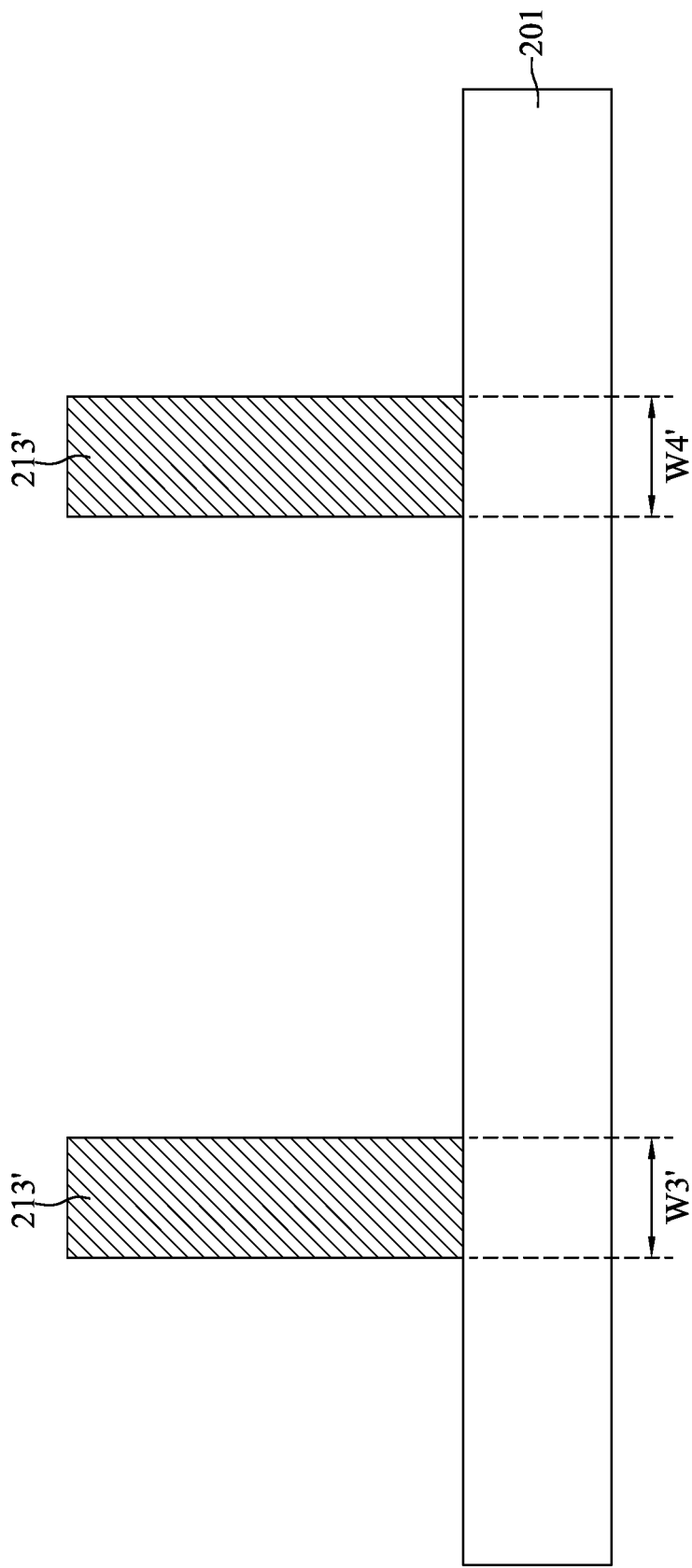
FIG. 20 is a cross-sectional view illustrating an intermediate stage of removing the metal oxide layers during the formation of the semiconductor device structure, in accordance with some embodiments.

FIG. 20 is a cross-sectional view illustrating an intermediate stage of forming the semiconductor device structure 200b by the method 30 of FIG. 5 according to various embodiments of the present disclosure. Some processes used to form the semiconductor device structure 200b are similar to, or the same as those used to form the semiconductor device structure 200a, and details thereof are not repeated herein. In some embodiments, the step S41 of removing the metal oxide layers 215 is performed on the structure of FIG. 18, such that the top surface and the sidewalls of the remaining portions of the metal pillars 213' are exposed. Then, the dielectric layer 217 is formed covering the structure of FIG. 20, and the planarization process is performed to expose the remaining portions of the metal pillars 213' (i.e., the steps S43 and S45), as shown in FIG. 3 in accordance with some embodiments. After the planarization process is performed, the semiconductor device structure 200b is obtained. In some embodiments, the sidewalls of the remaining portions of the metal pillars 213' are in direct contact with the dielectric layer 217.

In some embodiments of the present disclosure, the fabrication processes shown in FIGS. 15-19 can also be applied to prepare conductive contacts with different widths in the dielectric layer in a similar way, which is not repeated herein for clarity.

Embodiments of the semiconductor device structure 100, 200a and 200b and method for preparing the same are provided in the disclosure. In some embodiments, the semiconductor device structure 100 includes the conductive contacts 149a and 149b penetrating through the dielectric layer 103 over the semiconductor substrate 101. The conductive contact 149a includes the metal filling layer 147a and the metal silicide structure 145a surrounding the metal filling layer 147a, and the conductive contact 149b includes the metal filling layer 147b and the metal silicide structure 145b surrounding the metal filling layer 147b. In some embodiments, the conductive contacts 149a and 149b have different widths (e.g., the widths W1 and W2 are different). The conductive contacts 149a and 149b with different widths may be formed in similar processing steps using similar materials. As a result, the method for preparing the semiconductor device structure 100 is simple and the fabrication cost and time of the semiconductor device structure 100 can be reduced.

In some embodiments, the semiconductor device structure 200a includes the conductive contacts 213' formed in the dielectric layer 217 over the semiconductor substrate 201. In some embodiments, the semiconductor device structure 200a also includes metal oxide layers 215 separating the conductive contacts 213' from the dielectric layer 217. The conductive contacts 213' are formed by performing a treatment process (e.g., an oxidation process) on the metal pillars 213 to reduce the widths of the metal pillars 213, and the remaining portions of the metal pillars 213 become the conductive contacts 213'. In some embodiments, the metal oxide layers 215 are also formed by the treatment process. As a result, the method for preparing the semiconductor device structure 200a is simple and the fabrication cost and time of the semiconductor device structure 200a can be reduced.

In one embodiment of the present disclosure, a semiconductor device structure is provided. The semiconductor device structure includes a dielectric layer disposed over a semiconductor substrate, and a first conductive contact penetrating through the dielectric layer. The first conductive contact includes a first metal filling layer and a first metal silicide structure surrounding the first metal filling layer. The semiconductor device structure also includes a second conductive contact penetrating through the dielectric layer. The second conductive contact includes a second metal filling layer and a second metal silicide structure surrounding the second metal filling layer, and a first width of the first conductive contact is different from a second width of the second conductive contact.

In another embodiment of the present disclosure, a semiconductor device structure is provided. The semiconductor device structure includes a dielectric layer disposed over a semiconductor substrate, and a conductive contact penetrating through the dielectric layer. The semiconductor device structure also includes a metal oxide layer separating the conductive contact from the dielectric layer. The conductive contact and the metal oxide layer include a same metal.

In another embodiment of the present disclosure, a method for preparing a semiconductor device structure is provided. The method includes forming a dielectric layer over a semiconductor substrate, and forming a first opening and a second opening penetrating through the dielectric layer. A first width of the first opening is different from a second width of the second opening. The method also includes forming a first metal silicide structure and a second metal silicide structure in the first opening and the second opening, respectively. The forming the first metal silicide structure and the second metal silicide structure includes forming a first silicon-containing layer and a second silicon-containing layer lining the first opening and the second opening, respectively, and transforming the first silicon-containing layer and the second silicon-containing layer into a first metal silicide layer and a second metal silicide layer, respectively. The method further includes filling a remaining portion of the first opening with a first metal filling layer and filling a remaining portion of the second opening with a second metal filling layer.

In yet another embodiment of the present disclosure, a method for preparing a semiconductor device structure is provided. The method includes forming a sacrificial layer over a semiconductor substrate, and forming an opening penetrating through the sacrificial layer. The method also includes filling the opening with a metal pillar, and removing the sacrificial layer after the metal pillar is formed. The method further includes reducing a width of the metal pillar after the sacrificial layer is removed.

The embodiments of the present disclosure have some advantageous features. In some embodiments, the semiconductor device structure includes conductive contacts with different widths, and each of the conductive contacts includes a metal filling layer and a metal silicide structure surrounding the metal filling layer. The method for preparing the semiconductor device structure having conductive contacts with different widths may be simple and the fabrication cost and time of the semiconductor device structure may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
   a dielectric layer disposed over a semiconductor substrate;
   a first conductive contact penetrating through the dielectric layer, wherein the first conductive contact comprises a first metal filling layer and a first metal silicide structure surrounding the first metal filling layer;
   a second conductive contact penetrating through the dielectric layer, wherein the second conductive contact comprises a second metal filling layer and a second metal silicide structure surrounding the second metal filling layer, and wherein a first width of the first conductive contact is different from a second width of the second conductive contact;
   a first metal oxide layer separating the first conductive contact from the dielectric layer, wherein the first conductive contact and the first metal oxide layer comprise a same metal; and
   a second metal oxide layer separating the second conductive contact from the dielectric layer, wherein the second conductive contact and the second metal oxide layer comprise a same metal.

2. The semiconductor device structure of claim 1, wherein the first metal filling layer is separated from the dielectric layer by the first metal silicide structure, and the second metal filling layer is separated from the dielectric layer by the second metal silicide structure.

3. The semiconductor device structure of claim 1, wherein the first metal filling layer is separated from the semiconductor substrate by the first metal silicide structure, and the second metal filling layer is separated from the semiconductor substrate by the second metal silicide structure.

4. The semiconductor device structure of claim 1, wherein a material of the first metal silicide structure is the same as a material of the second metal silicide structure.

5. The semiconductor device structure of claim 1, wherein a top surface of the first metal silicide structure is level with a top surface of the first metal filling layer, and a top surface of the second metal silicide structure is level with a top surface of the second metal filling layer.

6. The semiconductor device structure of claim 1, wherein the first metal silicide structure and the second metal silicide structure each comprise multiple sub-layers.

* * * * *